United States Patent [19]

Rai-Choudhury et al.

[11] 4,247,859

[45] Jan. 27, 1981

[54] EPITAXIALLY GROWN SILICON LAYERS WITH RELATIVELY LONG MINORITY CARRIER LIFETIMES

[75] Inventors: Prosenjit Rai-Choudhury, Murrysville; Dieter K. Schroder, Pittsburgh, both of Pa.

[73] Assignee: Westinghouse Electric Corp., Pittsburgh, Pa.

[21] Appl. No.: 528,956

[22] Filed: Nov. 29, 1974

Related U.S. Application Data

[62] Division of Ser. No. 321,406, Jan. 5, 1973, abandoned.

[51] Int. Cl.³ .......................................... H01L 27/12
[52] U.S. Cl. .................................... 357/4; 357/42; 357/49; 357/89
[58] Field of Search .................... 357/4, 48, 49, 42, 89

[56] References Cited

U.S. PATENT DOCUMENTS

| 3,237,062 | 2/1966 | Murphy | 357/48 |
| 3,418,181 | 12/1968 | Robinson | 357/34 |

OTHER PUBLICATIONS

Heiman et al., Solid–State Electronics, vol. 11, 1968, pp. 411–418.
Allison et al., Proc. IEEE, vol. 57, No. 9, Sep. 1969, pp. 1490–1498.

*Primary Examiner*—William D. Larkins
*Attorney, Agent, or Firm*—C. L. Menzemer

[57] ABSTRACT

A semiconductor device such as a film or hybrid integrated circuit is provided having a relatively lightly doped, epitaxially grown silicon layer with a relatively long minority carrier lifetime. The lightly doped silicon layer of less than about $1 \times 10^{17}$ per $cm^3$ is grown on a heavily doped silicon layer of greater than about $1 \times 10^{19}$ and preferably greater than about $1 \times 10^{20}$ per $cm^3$ formed with phosphorus or boron impurity. The heavily doped silicon layer is preferably formed, either in a semiconductor body or an epitaxial layer on an insulator substrate, preferably by diffusing the impurity into the body or epitaxial layer. Preferably, the semiconductor device is a thin-film device and most desirably a silicon-on-sapphire device.

3 Claims, 17 Drawing Figures

EPITAXIALLY GROWN SILICON LAYERS WITH RELATIVELY LONG MINORITY CARRIER LIFETIMES

This is a division of application Ser. No. 321,406 filed Jan. 5, 1973, now abandoned.

FIELD OF THE INVENTION

The present invention relates to semiconductor devices such as film and hybrid integrated circuits formed by epitaxial silicon layers.

BACKGROUND OF THE INVENTION

An integrated circuit (IC) is a combination of interconnected circuit elements inseparably associated on or within a continuous substrate, the substrate being the supporting material upon which or within which an integrated circuit is fabricated or to which an integrated circuit is attached. An integrated circuit is generally fabricated within a chip of semiconductor material, usually silicon, with the resistors, capacitors, diodes, transistors, etc. (as required) built into and/or on the chip. The semiconductor body is either single crystal material or single crystal islands in a polycrystalline material, depending on the method for electrical isolation of the circuit components.

Epitaxial silicon layers are routinely deposited on silicon substrates during the manufacture of film and hybrid integrated circuits. The deposition of high quality single-crystal silicon on an insulator, however, places rigid demands on the insulator. The selection of spinel and sapphire as film substrates are natural choices because they provide lattice planes that are close matches to those of silicon. However, irrespective of the substrate, such epitaxial silicon layers have limited applications by reason of their minority carrier lifetimes.

Silicon layers are epitaxially grown on sapphire substrates (silicon-on-sapphire) in the fabrication of high-speed integrated circuits. But such silicon layers are particularly limited in their applications by their very low minority carrier lifetimes (typically about 10 nanoseconds). See Allison, Dumin, Heiman, Mueller and Robinson, Proc. IEEE, 57, 1490 (1969). The application for such silicon layers has been mainly limited to enhancement-mode MOS transistors. However, even in this application the low minority carrier lifetime is deleterious to the electrical characteristics of the device. While the operation of enhancement-mode MOS transistors is not dependent upon minority carriers, the minority carrier lifetime is important in that it determines the leakage current of the reverse biased drain PN junction. This leakage current is especially important in complementary MOS transistor circuits, where the ultimate quiescent power dissipation is determined by the leakage current of the drain diode. The leakage current is inversely proportional to the minority carrier lifetime in the PN junction space-charge region.

Epitaxially grown silicon layers on substrates such as sapphire cannot be used in the making of bipolar transistors. Even though the base widths of such devices are usually very narrow, minority carrier lifetime is extremely important to the gain of bipolar transistors. Both hydrogen chloride (HCl) and chlorine ($Cl_2$) injection have been used during oxidation to raise the lifetime of such devices into the 40-50 nanosecond range. See, Robinson and Heiman, J. Electrochem. Soc. 118, 141 (1971); and Ronen and Robinson, J. Electrochem. Soc. 119, 747 (1972). The mechanism responsible is believed to be a gettering action of metallic impurities through the formation of volatile metal chlorides. However, even 50 nanoseconds, which corresponds to a diffusion length of a few microns, is too low for the fabrication of bipolar transistors.

Despite all this, the ability to isolate components formed with epitaxially grown silicon layers by using the insulating properties of the substrate and the lower capacitance associated with PN junctions formed in such layers make such layers extremely desirable in integrated circuit fabrication. Such films would be generally used in integrated circuits if minority carrier lifetimes in the microsecond range could be achieved.

SUMMARY OF THE INVENTION

A semiconductor device such as a film or hybrid integrated circuit is made with a region with relatively large minority carrier lifetime. The region comprises a relatively lightly doped silicon layer with an impurity concentration less than about $1 \times 10^{17}$ per $cm^3$ epitaxially grown on a heavily doped silicon layer. The heavily doped silicon layer has an impurity concentration greater than about $1 \times 10^{19}$ per $cm^3$, and most desirably greater than $1 \times 10^{20}$ per $cm^3$, of an impurity selected from the group consisting of phosphorus and boron.

The heavily doped semiconductor layer may be formed in a single-crystal body of silicon or in an epitaxy layer of silicon grown on an insulator or semiconductor substrate. In the latter case, the lightly doped silicon layer is preferably heavily doped by diffusion of the selected impurity into the already formed epitaxial layer.

It is believed that the heavy doping with relatively small atoms contracts the lattice structure of the silicon and makes metals such as sodium, copper, silver and gold more soluble in the heavily doped silicon layer. Thus, when the lightly doped silicon layer is epitaxially grown, the heavily doped layer acts as a getter to substantially reduce the concentration of metals, and possibly other lifetime killing impurities, in the lightly doped layer.

The invention is particularly useful in thin-film devices which are epitaxially grown on insulator substrates such as spinel (e.g. $MgO: Al_2O_3$) or sapphire ($Al_2O_3$). These substrates, and sapphire in particular, are noted for their low diffusion coefficients to heavy metals. This is in contrast to the diffusion coefficient of heavy metals in single-crystal bulk silicon. These insulators are therefore unable to reduce by diffusion the lifetime killing impurities introduced into thin-epitaxial grown layers by use of known epitaxy techniques. By use of the present invention, the minority carrier lifetime in an active region of such devices can be increased at least one order of magnitude.

Thin-film devices and particularly silicon-on-sapphire devices can be used in applications heretofore unfeasible by use of the present invention. In such devices, the heavily doped silicon layer is preferably about 3 microns or less in thickness and the lightly doped silicon layer is preferably greater than about 1 micron.

Other details, objects and advantages of the invention will become apparent as the following description of the present preferred embodiments of and the present preferred methods of practicing the same proceeds.

BRIEF DESCRIPTION OF THE DRAWINGS

In the accompanying drawings, the present preferred embodiments of the invention and present preferred methods of practicing the invention are illustrated in which.

DESCRIPTION OF THE PREFERRED EMBODIMENTS

Figure 1:
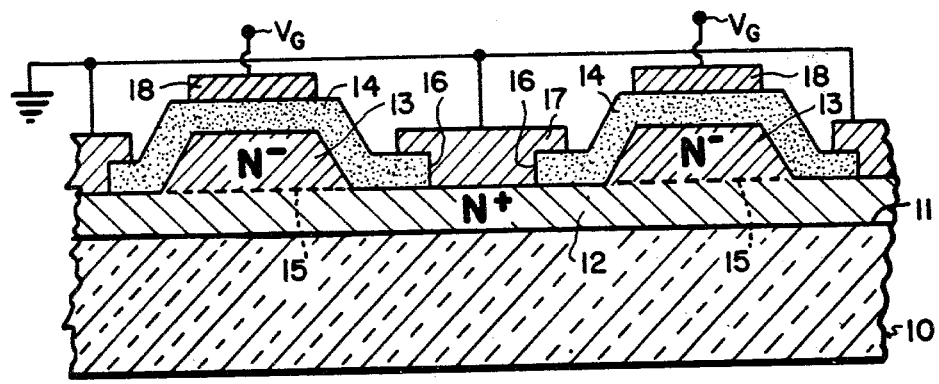
FIG. 1 is a cross-sectional view in elevation of a MOS capacitor of an integrated circuit made in accordance with the present invention.

Referring to FIG. 1, a series of MOS capacitors are shown in a thin-film integrated circuit. The capacitors are formed on insulator substrate 10 having major surface 11. The substrate may be spinel such as magnesium aluminate having the formula $MgO \times Al_2O_3$ where x can have values between about 0.64 and 6.7. A single-crystal spinel magnesium aluminate is commercially available in which x equals approximately 3.3. However, substrate 10 is preferably sapphire ($Al_2O_3$) wherein the major surface is mechanically polished in the ($1\bar{1}02$) crystallographic orientation.

After appropriate treatment to remove damaged portions and to clean surface 11, silicon layer 12 is epitaxially grown on surface 11. Preferably layer 12 is deposited on the sapphire substrate by pyrolysis of monosilane ($SiH_4$) in hydrogen carrier gas at between 1025° and 1100° C. at a rate of about 2 to 3 microns per minute. Layer 12 is preferably of thickness between 2 and 3 microns.

Phosphorus is then diffused into layer 12 by standard constant-source, preferably open tube techniques. Preferably the diffusion source is phosphine ($PH_3$). The layer 12 is thus heavily doped with phosphorus preferably to a concentration to between $1 \times 10^{20}$ and $1 \times 10^{21}$ per $cm^3$.

Thereafter, a relatively lightly doped N-silicon layer 13 is epitaxially grown on heavily doped layer 12 by standard techniques to form NN junction 15 therewith. Preferably pyrolysis of monosilane in hydrogen carrier gas is again used at a temperature between 1025° and 1100° C. The impurity source inputted to the system is preferably phosphine ($PH_3$) or arsine ($AsH_3$). Again the epitaxy proceeds at about 2 to 3 microns per minute until layer 13 attains a thickness greater than 1 micron and preferably between 2 and 3 microns.

Layer 13 as epitaxially grown is a non-selective layer. The layer is then selectively masked by standard photolithographic techniques and selectively etched with a suitable etchant such as potassium hydroxide (KOH) to form islands of layer 13 as shown in FIG. 1.

Silicon dioxide layer 14 is then deposited over the exposed surfaces of layers 12 and 13. Preferably the oxide layer is vapor deposited at about 750° C. to a thickness of about 2500 Angstroms.

Windows 16 are then opened in oxide layer 14 by standard photolithographic and etching techniques to expose portions of layer 12. Metal contacts 17 and 18 are then simultaneously formed to make ohmic contact with layer 12 and the MOS contact with layer 13, respectively. This can be accomplished by vapor depositing aluminum or some other suitable metal over the structure to close windows 16 and form a contiguous overlayer. "Reverse" or "negative" photomasking and etching techniques are then used to remove the metal layer from everywhere but in and adjacent to the windows 16 and at the position desired for the MOS contact. The metal remaining in contact windows is then alloyed to the silicon of layer 12 by heating to form low resistance ohmic contacts.

The result is a thin-film integrated circuit containing a series of MOS capacitors.

Figure 2:
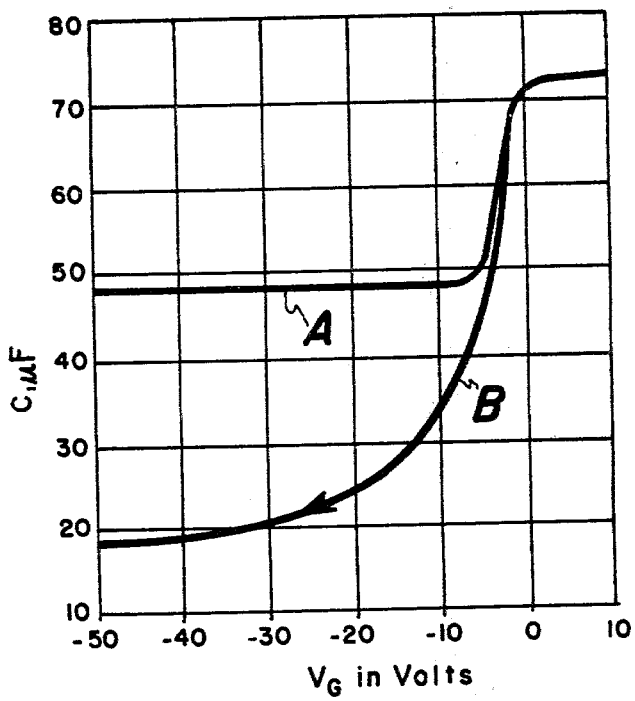
FIG. 2 is a graph showing the C-V characteristics of a MOS capacitor similar to that shown in FIG. 1.
Figure 3:
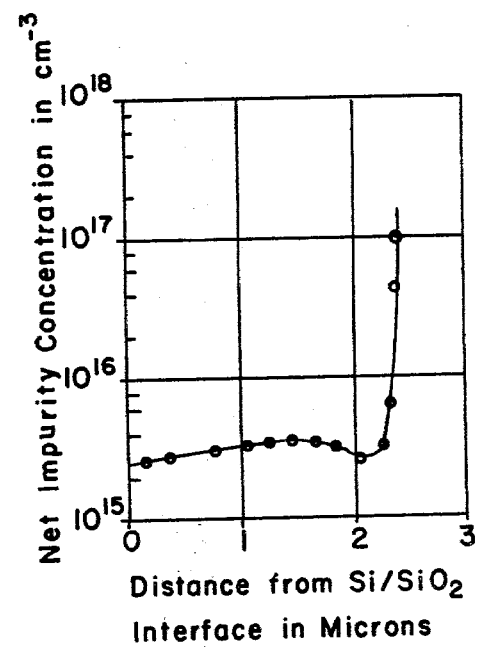
FIG. 3 is a graph showing the impurity concentration in the lightly doped silicon layer of a MOS capacitor as shown in FIG. 1 as a function of distance from the interface with the silicon dioxide layer.
Figure 4:
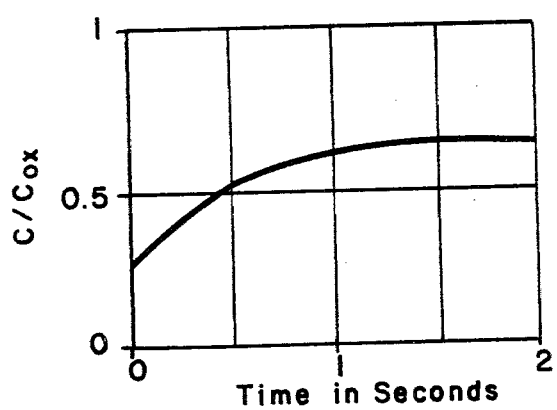
FIG. 4 is a graph showing the C-t response of a MOS capacitor as shown in FIG. 1.

Referring to FIGS. 2, 3 and 4, MOS capacitors similar to those just described were tested for impurity concentration distribution and minority carrier lifetime.

The silicon-on-sapphire layers of the devices tested were grown in a horizontal reactor heated by an external RF induction coil. The graphite susceptor was cleaned and coated with pure silicon at about 1500° C. prior to the epitaxial growth of each of layer 12 and 13. The sapphire substrates 10 mechanically polished to provide surface 11 with a (1̄102) crystallographic orientation. Damage was removed from surface 11 by heat treating some substrates at about 1475° C. for 4 hours in air. Some substrates were not heat treated. The substrates were then cleaned prior to loading into the reactor by degreasing by boiling in $H_2SO_4$—$HNO_3$ mixture and then chelating in $H_2O_2$—$H_2SO_4$.

The MOS capacitors used in testing were otherwise made as above described in connection with FIG. 1, except for the contacts 16 and 17. The contacts were formed directly by selective evaporation through a metal mask overlaying the structure. The device was then annealed in hydrogen at 400° C. for one hour to eliminate surface states so that lifetime measurement could be more easily accomplished.

The doping profiles were measured by the spreading resistance and pulsed MOS capacitor techniques, see Mazur and Dickey, J. Electrochem. Soc. 113, 255 (1966) and van Gelder and Nicollian, J. Electrochem. Soc. 118, 138 (1971). The minority carrier lifetimes were measured by the pulsed MOS capacitor method in which the device is pulse biased into deep depletion and then relaxed to its quasi-equilibrium state, see Schroder and Gulberg, Solid-State Electronics, 14, 1285 (1971).

In FIG. 2, the C-V characteristic of the MOS capacitor is shown. The C-V measurements were done at 77° K. so that the curve of doping versus depth could be conveniently plotted. This was done after it was verified on a bulk-silicon MOS capacitor that the doping versus depth curve obtained from 300° K. C-V data was identical to that obtained from 77° K. data. From the C-V curve the doping profile can be calculated and plotted as shown in FIG. 3.

A typical C-t response for the N- layer 13 with a minority carrier lifetime of 2.5 microseconds is shown in FIG. 4. More meaningful results are shown in Table I below where the structure, growth temperature, growth rate, impurity concentration and minority carrier lifetime are tabulated for MOS capacitors embodying both the invention and the prior art.

TABLE I

| Run No. | Structure | Growth Temp. (°C.) | Growth Rate (μm/min) | Impurity Concentration ($N_D$) ($cm^{-3}$) | Minority Carrier Lifetime ($\tau g$) (μsec) |
|---|---|---|---|---|---|
| 1 | N layer-on-sapphire | 1050 | 0.7 | $7 \times 10^{15}$ | 0.020 |
| 2 | N layer-on-sapphire | 1025 | 2.3 | $1 \times 10^{16}$ | 0.045 |
| 3 | N layer-on-N+ layer-on-sapphire | 1025 | 2.3 | $1 \times 10^{16}$ | 0.25 |
| 4 | N layer-on-N+ layer-on-sapphire | 1025 | 2.3 | $4 \times 10^{15}$ | 1.5 |

From Table I, it is already seen that the present invention increases the minority carrier lifetime of silicon-on-sapphire devices at least one order of magnitude. Run Nos. 1 and 2 show tyical minority carrier lifetimes as reported in the prior art of 20 and 45 nanoseconds, respectively. By contrast by use of the present invention in Run Nos. 3 and 4, where a silicon layer doped with phosphorus is interposed between the arsenic doped silicon layer and the sapphire substrate, minority carrier lifetimes of 250 and 1500 nanoseconds respectively were measured.

In other similar tests, minority carrier lifetimes as high as 3 microseconds (3000 nanoseconds) were measured in the arsenic doped silicon layer utilizing the present invention.

Similar devices were made to illustrate the utility of the invention for making semiconductor devices in hybrid integrated circuits. The results of these tests are shown in FIGS. 5 through 9.

Single-crystal N-type silicon substrates were made by the float zone and Czochralski techniques. The substrates were either: (i) heavily doped with phosphorus to $1 \times 10^{20}$ per $cm^3$ (0.0009 ohm-cm resistivity), (ii) lightly doped with phosphorus to $5 \times 10^{14}$ per $cm^3$ (10 ohm-cm resistivity), or (iii) heavily doped with antimony to $7 \times 10^{18}$ (0.008 ohm-cm resistivity). The substrates were mechanically and chemically processed so that a major surface of each was crystallographically oriented 2° off from the (111) crystal plane.

Each substrate and particularly said major surface thereof was cleaned by degreasing in acetone and trichloroethylene and followed by boiling in sulfuric-nitric acid ($H_2SO_4:NHO_3:3:1$). Some of the substances were then chelated using ammoniumethylenediaminetetracetate, a complexing agent for removing metal ions from the substrate surfaces. After degreasing, boiling and chelating (if used), each substrate was extensively rinsed in Super-Q water, i.e. continuously recycled deionized water.

Following an in situ hydrogen chloride etch, either N and/or P doped silicon layers were then epitaxially grown on the major surface of the silicon substrates at different temperatures, i.e. 1100°, 1150° and 1250° C. Epitaxial growth was performed in a horizontal reactor with external RF induction heaters. The graphite susceptor was cleaned and coated with silicon prior to each run. Silicon was deposited from silicon tetrachloride ($SiCl_4$) in hydrogen carrier gas. The hydrogen was palladium (Pd) purified, and all materials were of ultra-pure grade. The impurity was introduced into the system as either arsine ($AsH_3$) or diborane ($B_2H_6$) gas to provide an impurity concentration in the lightly doped layer of about 1 to $2 \times 10^{15}$ per $cm^3$. The epitaxial growth was continued at a rate of about 1 micron per minute until the layer attained a thickness of about 30 microns.

The epitaxial layers were measured for minority carrier lifetime and PN junctions formed in and by the epitaxial layers were measured for current-voltage characteristics. These PN junctions were of three types, (i) shallow diffused junctions into the epitaxial layers (boron diffusion into N doped epitaxial layers); (ii) substrate-epitaxial junctions (only used for boron-doped epitaxial layers on N-doped substrates); (iii) epitaxial-epitaxial junctions formed by growing a layer of opposite type conductivity on a first epitaxially grown layer. For the junction measurements, particular emphasis was placed on the reverse breakdown voltage of the junctions.

Figure 5:
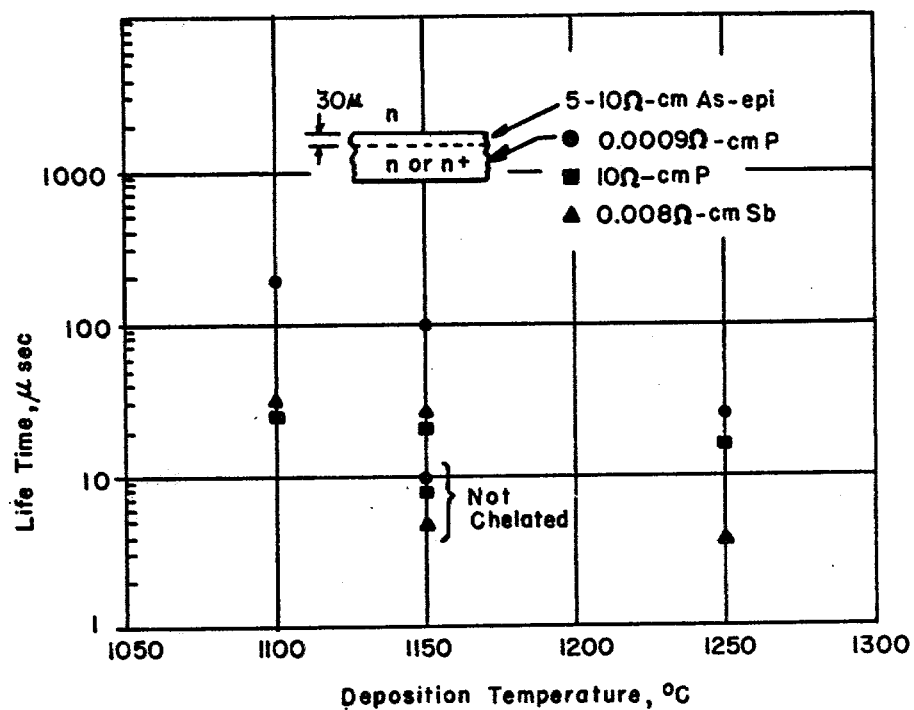
FIG. 5 is a graph showing a comparison of the minority carrier lifetimes of relatively lightly doped epitaxial silicon layers made in accordance with the present invention and otherwise variously made.

The minority carrier lifetime measurements for the N-doped epitaxial layers on N-doped substrates are shown in FIG. 5. Each point shown is an average of ten (10) measurements with different devices. The effect of the variation in cleaning procedure is shown by comparing the measured lifetimes at 1150° C. for the three different structures. The structures wherein the substrate was chelated before epitaxial growth had significantly higher lifetimes. It is believed that this demonstrates the heavy metal complexing property of the chelating agent.

The increase in minority carrier lifetime with the present invention is clearly observed in FIG. 5. Irrespective of the growth temperature, the lifetime was consistently greater for N doped epitaxial silicon layers on heavily phosphorus doped silicon substrates. Minority carrier lifetimes as high as 200 microseconds were recorded at a growth temperature of 1100° C. utilizing the present invention.

It is also observed from FIG. 5 that the minority carrier lifetime increases with decreases in growth temperature. It is believed that this is caused by a reduction in the quantity of heavy metals introduced into the epitaxy system at the lower temperature.

Figure 6:
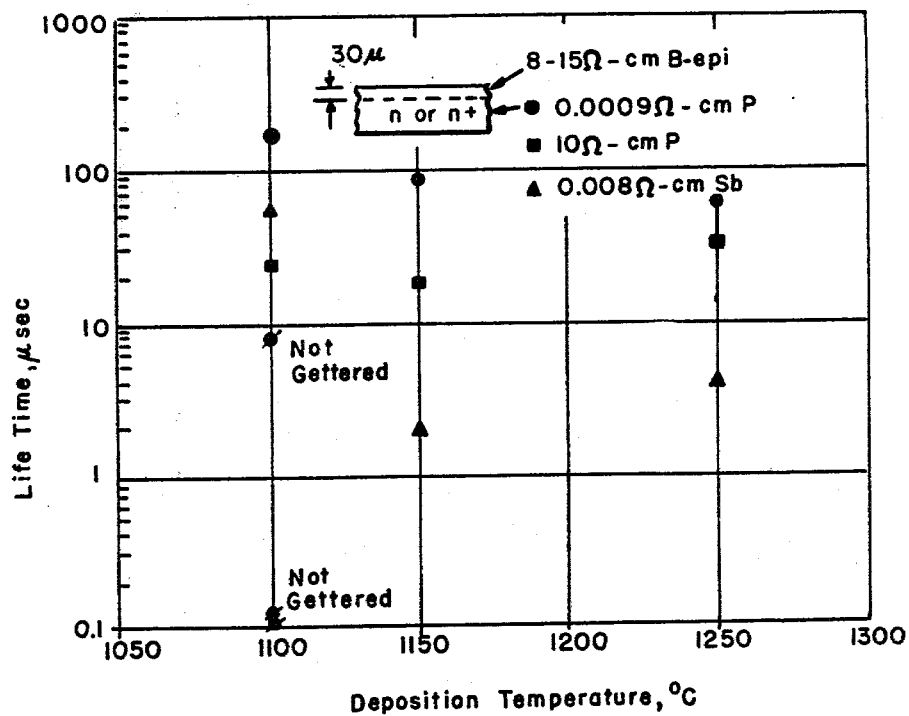
FIG. 6 is a graph showing a comparison of the minority carrier lifetimes of relatively lightly doped epitaxial silicon layers made in accordance with the present invention with other variously made epitaxial layers.

Referring to FIG. 6, the minority carrier lifetime measurements for P-doped epitaxial silicon layers on N-doped silicon substrates are shown. Each point shown is again an average of ten (10) measurements with different devices. Having found with N-doped epitaxial silicon layers that chelating had a significant effect on the lifetime, all substrates were chelated prior to P-epitaxial growth. The results were virtually identical with the observations with N-epitaxial growth. Consistently higher minority carrier lifetimes were recorded utilizing heavily phosphorus doped silicon as a base for the epitaxially grown layer, with the best results achieved at lower growth temperatures.

However, in contrast to the tests done with N-doped epitaxial silicon layers, subsequent gettering of the boron doped epitaxial silicon layers in a two-zone $P_2O_5$ furnace with the getter source at 250° C. and the silicon substrates at 950° C. (in an argon atmosphere for 45 minutes) improved the lifetimes significantly. For example, at 1150° C. growth temperature, such gettering procedure increased the lifetime by a factor of over 100 as shown by FIG. 6. Similar effects were measured at the other deposition temperatures, but for those temperatures only the minority carrier lifetimes after gettering are shown in FIG. 6. By contrast, this gettering treatment had essentially no effect on the lifetimes in the N doped epitaxial silicon layers. The difference is believed to be due to a difference in heavy metal impurities introduced into the system with the use of the diborane dopant source.

Figure 7:
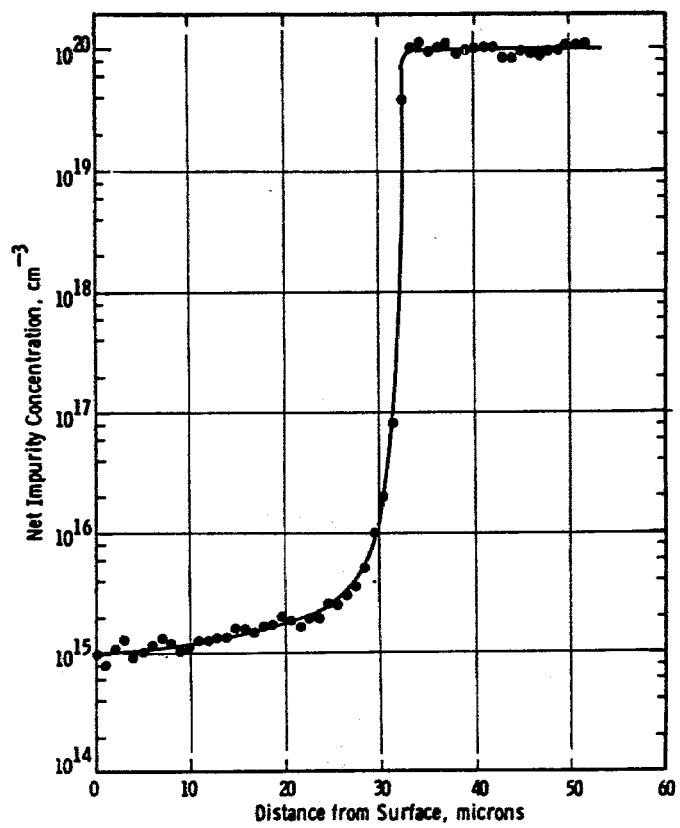
FIG. 7 is a graph showing the impurity concentration distribution of an epitaxial layer grown on a heavily doped silicon substrate.

Referring to FIG. 7, a typical impurity concentration profile of the tested N doped silicon layers on heavily phosphorus-doped silicon substrates is shown. The layer thickness was around 30 microns and the doping varied between $5 \times 10^{14}$ to $2 \times 10^{15}$ per cm$^3$, insuring bulk and not punch-through breakdown for all but the lowest impurity concentrations.

Figure 8:
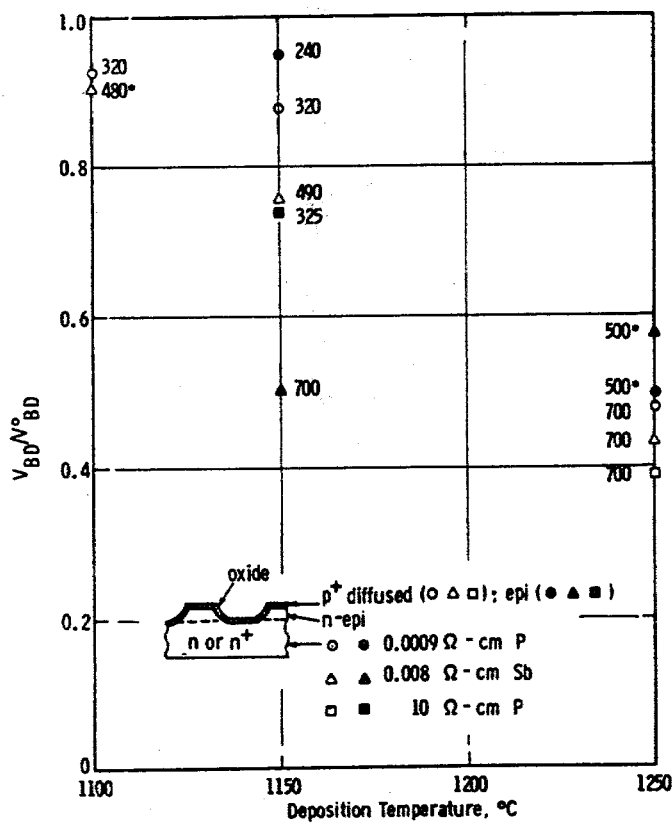
FIG. 8 is a graph comparing at different growth temperatures, the increased reverse voltage breakdown of N doped silicon layers in hybrid integrated circuits made by use of the present invention and otherwise made.

The diodes were formed by either a shallow boron diffusion into the silicon layer or growing a P-doped epitaxial silicon layer on the N-doped epitaxial silicon layer. 40 mil diameter mesa diodes were then produced by selective etching and subsequently passivated be deposition of an oxide layer as shown in the insert of FIG. 8. The results of voltage breakdown measurements are shown in FIG. 8 and Tables II and III below. The ratio of measured breakdown to the theoretical bulk breakdown values (corresponding to the layer doping) is plotted as a function of the deposition temperature. The open points refer to diffused diodes and the solid ones to epitaxial-epitaxial diodes. The numbers beside the points are the theoretical breakdown voltages, with the starred quantities indicating that the breakdown is determined by punch-through of the space-charge region to the N+ doped substrate.

The processing and growth conditions as well as doping concentrations of the silicon layers are given in Table II. The reverse voltage values are given for two values of current, less than 20 microamps and 5 milliamps. The 5 milliamps value was used as the breakdown voltage measure. Also shown are the theoretical breakdown voltages. Similar data for the epitaxial-epitaxial diodes are shown in Table III.

TABLE II
CHARACTERISTICS OF DIFFUSED DIODES ON N-DOPED EPITAXIAL SILICON LAYERS

| Substrate Doping | Growth Temp. | Epitaxial Layer Doping | Rev. Voltage at Current <20 μAmps | Rev. Voltage at Current 5 mAmps | $V_{BD}^t$ (in volts) |
|---|---|---|---|---|---|
| Heavily phosphorus resistivity 0.0009 Ω-cm | 1150 | $1 \times 10^{15}$ | 250 | 320 | 320 |
| | 1100 | $1 \times 10^{15}$ | 265 | 300 | 320 |
| | 1150 | $1 \times 10^{15}$ | 220 | 280 | 320 |
| | 1250 | $4 \times 10^{14}$ | 260 | 335 | 700 |
| | 1150 | $1 \times 10^{15}$ | 255 | 310 | 320 |
| Heavily antimony resistivity 0.008 Ω-cm | 1150 | $6 \times 10^{14}$ | 250 | 400 | 490 |
| | 1100 | $4 \times 10^{14}$ | 265 | 440 | 480* |
| | 1150 | $6 \times 10^{14}$ | 250 | 370 | 490 |
| | 1250 | $4 \times 10^{14}$ | 235 | 300 | 700 |
| | 1150 | $5 \times 10^{14}$ | 240 | 470 | 580 |
| Lightly phosphorus resistivity 10 Ω-cm | 1250 | $4 \times 10^{14}$ | 200 | 275 | 700 |

*indicates theoretical punch-through breakdown voltage.

TABLE III
CHARACTERISTICS OF EPITAXIAL-EPITAXIAL DIODES ON N-DOPED EPITAXIAL SILICON LAYERS

| Substrate Doping | Growth Temp. | Epitaxial Layer Doping | Rev. Voltage at Breakdown | $V_{BD}^t$ (in volts) |
|---|---|---|---|---|
| Heavily phosphorus resistivity 0.0009 Ω-cm | 1150 | $1.5 \times 10^{15}$ | 235 at <10μAmps | 240 |
| | 1250 | $2 \times 10^{14}$ | 245 at <10μAmps | 500* |
| Heavily antimony resistivity 0.008 Ω-cm | 1150 | $4 \times 10^{14}$ | 350 at 200μAmps | 700 |
| | 1250 | $2 \times 10^{14}$ | 290 at 20μAmps | 500* |
| Lightly phosphorus resistivity 50 Ω-cm | 1150 | $1 \times 10^{15}$ | 240 at 20μAmps | 325 |

*indicates theoretical punch-through breakdown voltage.

The general trend of these measurements is in accord with the lifetime data, i.e. lower growth temperatures yielded devices with breakdown voltages closer to the theoretical values. Also, diodes fabricated on heavily phosphorus-doped silicon substrates per the present invention had higher breakdown values than the other two substrates. These diodes also exhibited better I-V characteristics, while the others frequently had a very low breakdown. The very low $V_{BD}$ of the lightly doped silicon layers (2 to $4 \times 10^{14}$ cm$^{-3}$, with their correspondingly high $V_{BD}^\circ$) may be partly due to surface effects.

Contrary to the lifetime data, the cleaning procedure had little influence on the breakdown characteristics. The chelating and $H_2O_2$ cleaning of the silicon substrates did not give significantly different results than those of the substrates not so cleaned.

It was also observed that the epitaxial-epitaxial diodes behaved very much like the diffused ones. This indicates that such junctions are not inherently poor, but that the junction characteristics are much more dependent on the quality of the silicon layer with the lower doping.

Figure 9:
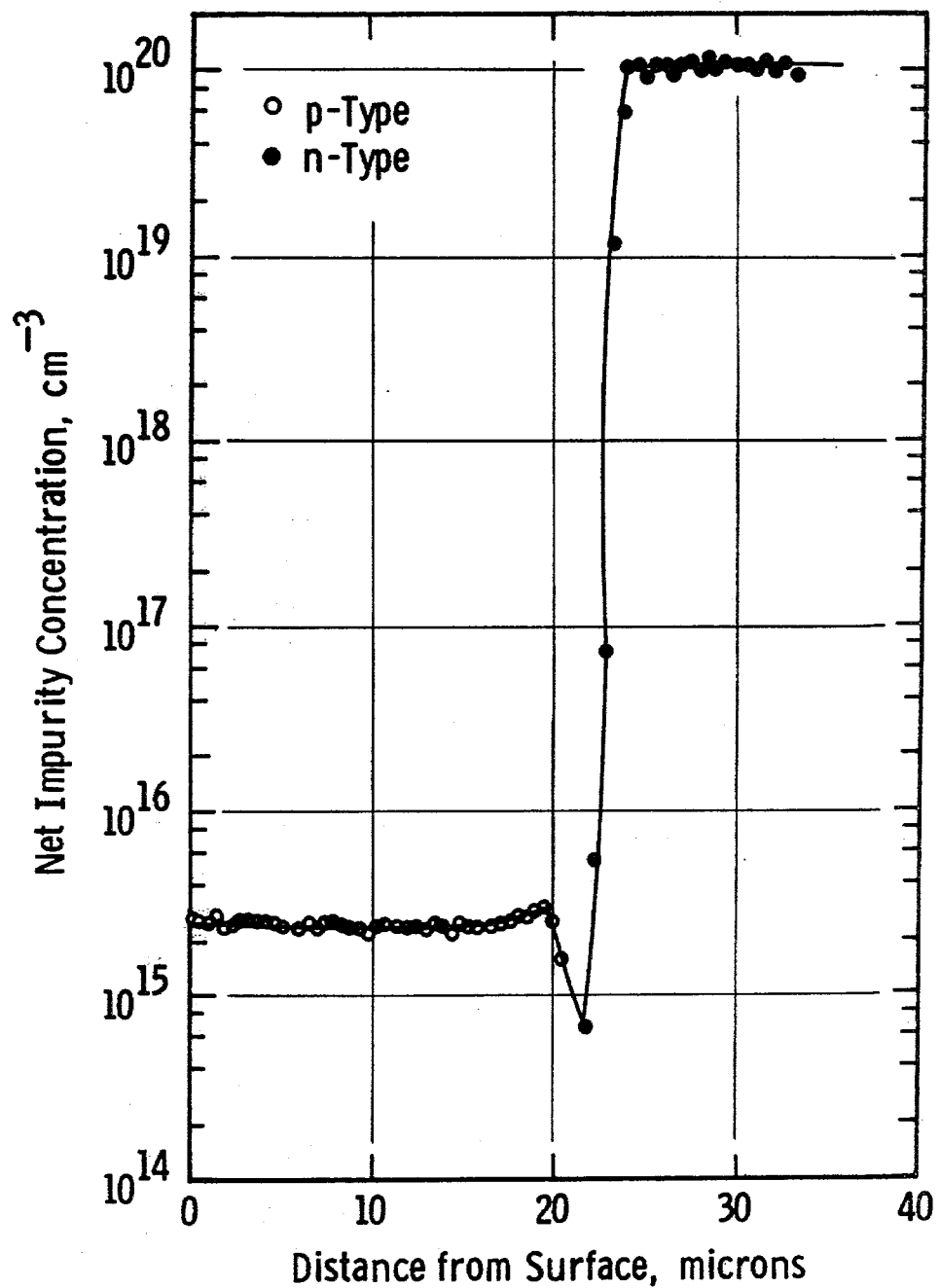
FIG. 9 is a graph showing the impurity concentration distribution of a PN junction formed in accordance with the present invention.

Referring to FIG. 9, a typical impurity concentration profile of a P-epitaxial silicon layer on a heavily phosphorus-doped substrate is shown. Since a natural PN junction is formed when a P-doped layer is grown on an N-doped substrate, only the substrate-epitaxial junctions were evaluated for these layers. The results for 1100° C. growth temperature, with chelating, are shown in Table IV.

TABLE IV

CHARACTERISTICS OF SUBSTRATE-EPITAXIAL DIODES ON P-DOPED EPITAXIAL SILICON LAYERS GROWN AT 1100° C.

| Substrate Doping | Gettering | Silicon Layer Doping (per cm$^3$) | Rev. Voltage at Current | | $V_{BD}$ (in volts) |
|---|---|---|---|---|---|
| | | | <20 μAmps | 5 mAmps | |
| Heavily phosphorous resistivity 0.0009 Ω-cm | None | $1 \times 10^{15}$ | 210 | 255 | 320 |
| | P$_2$O$_5$ | $1 \times 10^{15}$ | 250 | 280 | 320 |
| Heavily antimony resistivity 0.008 Ω-cm | None | $1 \times 10^{15}$ | 50 | 60 | 320 |
| | P$_2$O$_5$ | $1 \times 10^{15}$ | 45 | 60 | 320 |
| Lightly phosphorus resistivity 10 Ω-cm | None | $1 \times 10^{15}$ | 250 | 265 | 320 |
| | P$_2$O$_5$ | $1 \times 10^{15}$ | 280 | 315 | 320 |

As shown by these measurements, the diodes fabricated on phosphorus-doped silicon substrates had higher breakdown voltages than those on antimony-doped silicon substrates, the same as previously measured on N-doped silicon layers. However, there was no notable difference between the lightly and heavily phosphorus-doped silicon substrates. As also shown by Table IV, phosphorus gettering had little effect on the breakdown voltage.

Similar to N-epitaxial silicon layers, higher growth temperatures yielded junctions with poorer reverse characteristics.

Similar tests were performed with boron-doped silicon substrates having an impurity concentration of about $1 \times 10^{20}$ per cm$^3$. An N or P silicon layer was epitaxially grown on each body to a thickness of 25 microns by deposition with a silicon tetrachloride-hydrogen system at about 1150° C. to form a PN or NN junction with the body. The N-layers were doped with arsenic to a concentration of about $1 \times 10^{15}$ per cm$^3$ and the P-layers were doped with a concentration of about $3 \times 10^{15}$ per cm$^3$. MOS capacitors were then formed as above described and the minority carrier lifetimes measured as above described. The N-doped epitaxial layer had a minority carrier lifetime of about 100 microseconds, while the P-doped epitaxial layer had a lifetime of 0.5 microseconds because of contamination from the diborane dopant source. It is demonstrated that the lifetime of the latter is improved by use of the gettering technique as above described.

Figure 13:
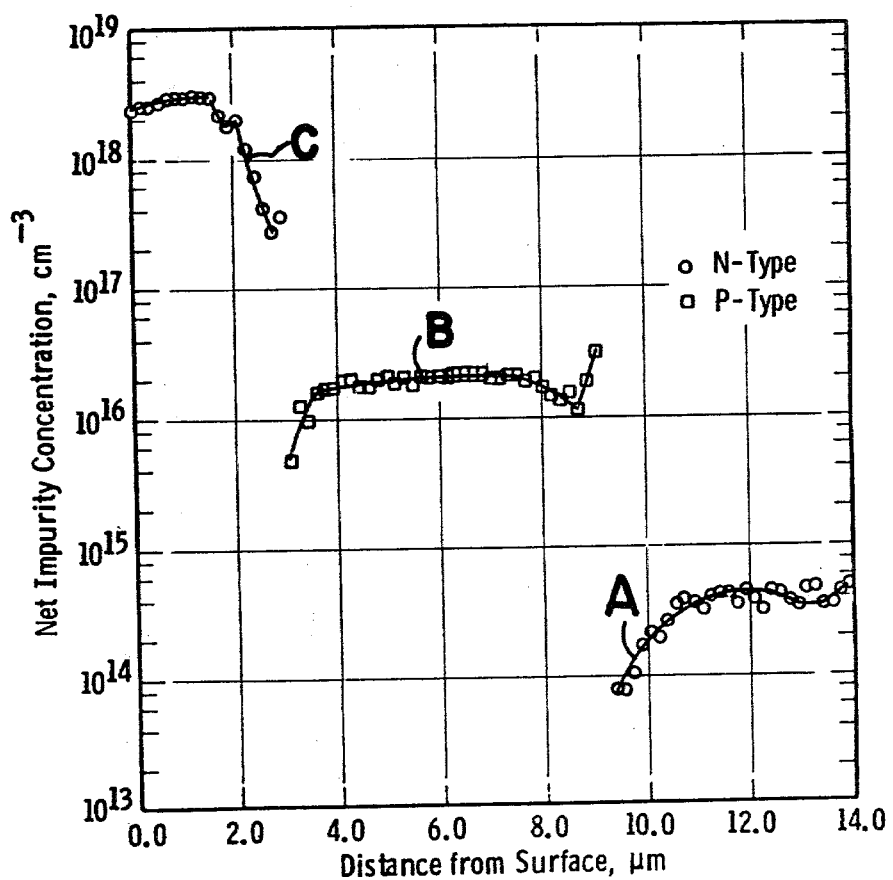
FIG. 13 is a graph showing the impurity concentration distribution of the active regions of a particular bipolar transistor similar to that shown in FIG. 10.
Figure 14:
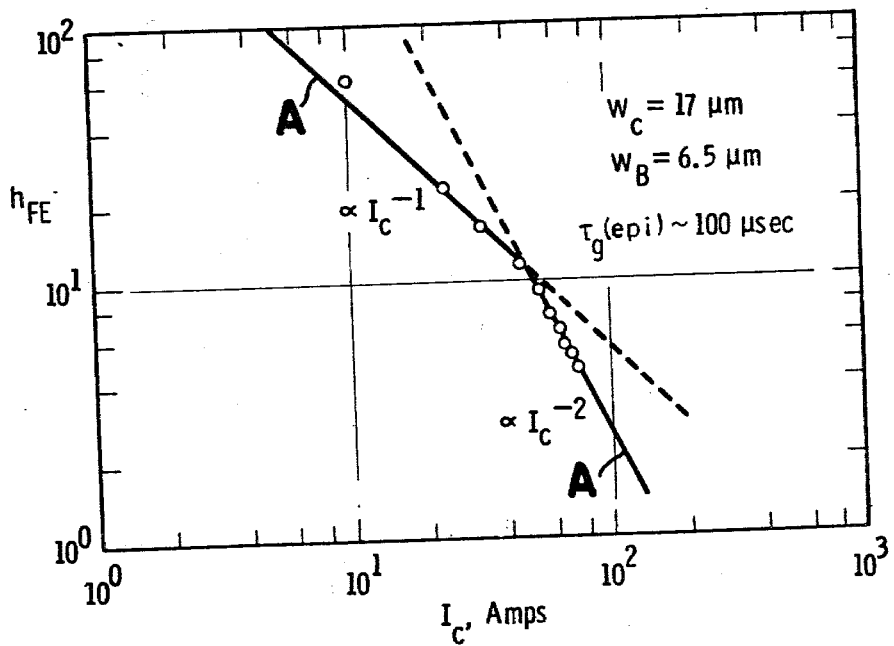
FIG. 14 is a graph showing gain as a function of current of the bipolar transistor whose impurity concentration distribution is shown in FIG. 13.
Figure 15:
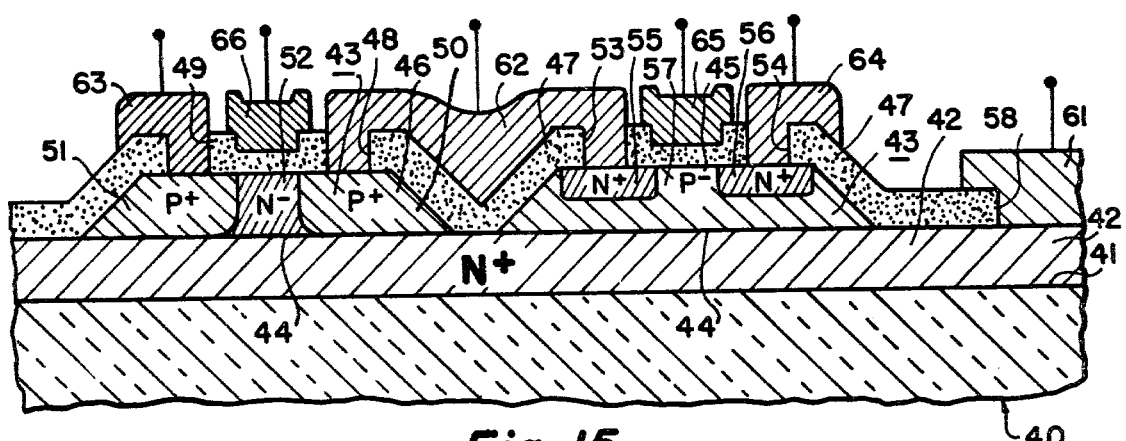
FIG. 15 is a cross-sectional view in elevation of a complementary MOS transistor circuit of a computer memory circuit made in accordance with the present invention.
Figure 16:
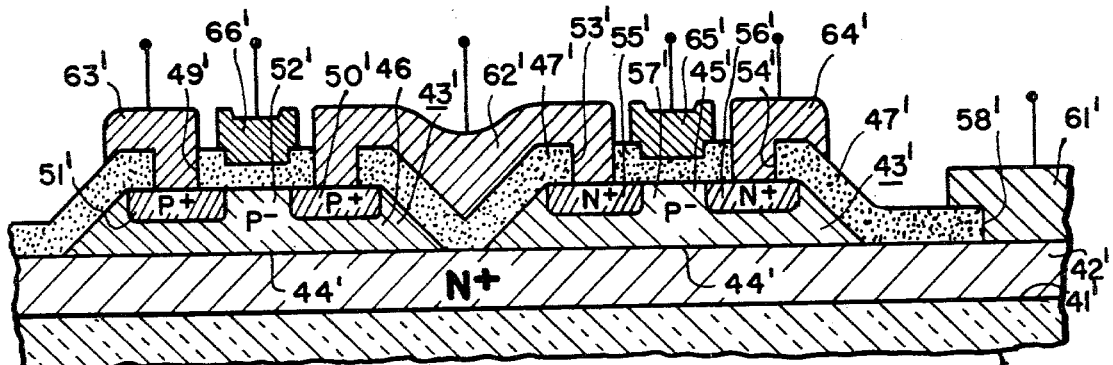
FIG. 16 is a partial cross-sectional view in elevation of an alternative complementary MOS transistor circuit of a computer memory circuit made in accordance with the present invention.
Figure 17:
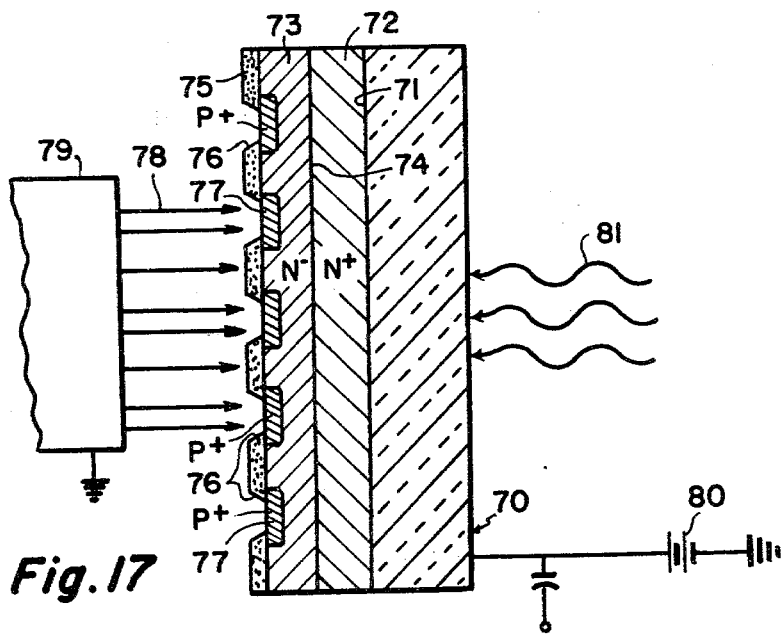
FIG. 17 is a cross-sectional view in elevation of an image sensing target of a high resolution television camera, as schematically shown, made in accordance with the present invention.

To further illustrate the utility of the present invention, reference is made to FIGS. 10 through 17. FIGS. 10 through 14 illustrate utilization of the invention for making bipolar transistors in hybrid and thin-film integrated circuits. FIGS. 15 and 16 show the application of the invention in making complementary MOS transistors for computer memory circuits. And FIG. 17 shows the utility of the invention in making high resolution sensing targets for television camera tubes.

Figure 10:
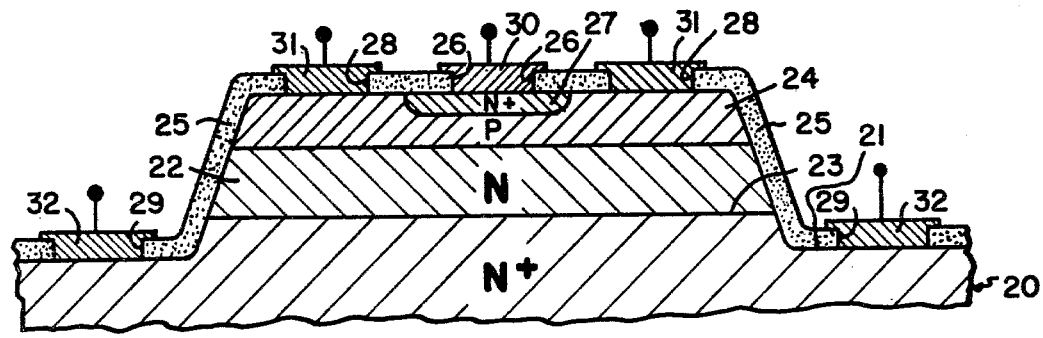
FIG. 10 is a cross-sectional view in elevation of a power bipolar transistor made in accordance with the present invention.

Referring to FIG. 10, a power bipolar NPN transistor is made in a mesa configuration. A single-crystal silicon body 20 is provided having a phosphorus impurity concentration of about $1 \times 10^{20}$ per cm$^3$. Body 20 is mechanically and chemically polished to provide major surface 21 with a crystallographic orientation 2° off from the (111) crystal plane.

Relatively lightly N-doped silicon layer 22 is epitaxially grown on major surface 21 to form a non-localized layer of a depth of about 17 microns and an NN junction 23 with body 20. Preferably silicon layer 22 is grown by deposition from a silicon tetrachloride in hydrogen carrier gas by standard techniques. Layer 22 is doped to about $8 \times 10^{14}$ per cm$^3$ with N- type impurity by inputting arsine (AsH$_3$) gas to the epitaxy system.

Thereafter, moderately P-doped silicon layer 24 is epitaxially grown on layer 22 to form a non-localized layer of a depth of about 8 microns. Preferably the same deposition system is used which was used to epitaxially grow layer 22. Layer 24 is doped to about $1 \times 10^{16}$ per cm$^3$ with P-type impurity by inputting diborane (B$_2$H$_6$) gas to the epitaxy system.

Layers 22 and 24 are then formed in islands as shown in FIG. 10 by selective etching. The surface of the epitaxially grown layers is selectively masked by a standard photolithographical technique exposing surfaces of the epitaxial layers which are to be removed. The exposed surfaces are then etched through windows in the masking layer with a suitable etchant such as potassium hydroxide (KOH) to selectively remove portions of layers 22 and 24 leaving the islands as shown in FIG. 10. Thereafter, the masking layer is removed.

Oxide layer 25 is then formed over the exposed surfaces of the structure to a depth of about 2500 Angstroms. Preferably layer 25 is formed by vapor depositing silicon dioxide over the exposed surface in a nitrogen atmosphere at about 700° C.

Windows 26 are then opened in oxide layer 25 to form the emitter regions 27 of transistor by standard photolithographic and diffusion techniques. Preferably, a constant-diffusion source of phosphine gas is diffused using an open-tube system. The diffusion is preferably at a surface impurity concentration of between $1 \times 10^{20}$ and $1 \times 10^{21}$ per cm$^3$ to a depth of about 1.5 microns.

Windows 28 and 29 are then opened in oxide layer 25 to expose surface portions of layers 24 and major surface 21, respectively, and provide ohmic contact to the base and collector regions, respectively, of the transistor. These windows are preferably opened by standard photolithographic and etching techniques.

Metal contacts 30, 31 and 32 are simultaneously formed to make ohmic contacts to the emitter, base and collector regions, respectively, of the transistors. This is accomplished by vaporizing aluminum or some other suitable metal over the structure to close windows 26, 28 and 29 and form a continuous metal layer over oxide layer 25. A "negative" mask with a standard photolithographic technique and an appropriate etchant such as 10% sodium hydroxide solution are used to remove the metal layer from everywhere but in and adjacent to closed windows 26, 28 and 29. The metal in the windows is then alloyed with the silicon by heating the body 20 to make low resistance ohmic contacts.

A series of NPN transistors are thus formed in a hybrid integrated circuit.

Figure 11:
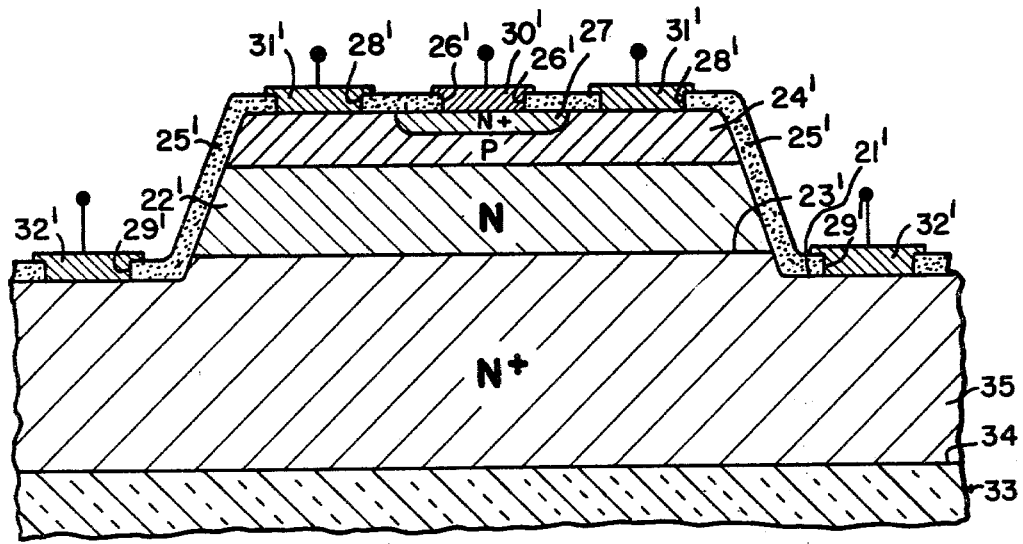
FIG. 11 is a cross-sectional view in elevation of an alternative bipolar transistor of an integrated circuit made in accordance with the present invention.

Referring to FIG. 11, similarly a series of low power NPN transistors are formed in a thin-film integrated circuit. A sapphire substrate 33 is provided with major surface 34 in a (1̄102) crystallographic orientation. Silicon layer 35 is then epitaxially grown on surface 34 to a depth of about 3 microns using pyrolysis of monosilane-hydrogen carrier gas system at a rate of about 2 to 3 microns per minute to reduce autodoping. Layer 35 is thereafter N-doped with phosphorus to an impurity concentration of about $1 \times 10^{21}$ per cm³ by standard diffusion techniques. Preferably, a constant diffusion source of phosphine (PH₃) is used in an open tube system to diffuse phosphorus into the layer 35.

Subsequently the transistors are formed on the heavily N-doped silicon layer 35 as described above in connection with FIG. 10, except for the thickness of the layers. N-doped silicon layer 22' is about 1.5 microns in thickness, P-doped silicon layer 24' is 0.8 microns in thickness and emitter region 27' is 0.4 microns in thickness. For convenience, prime numbers are used to designate the corresponding components as above described.

Figure 12:
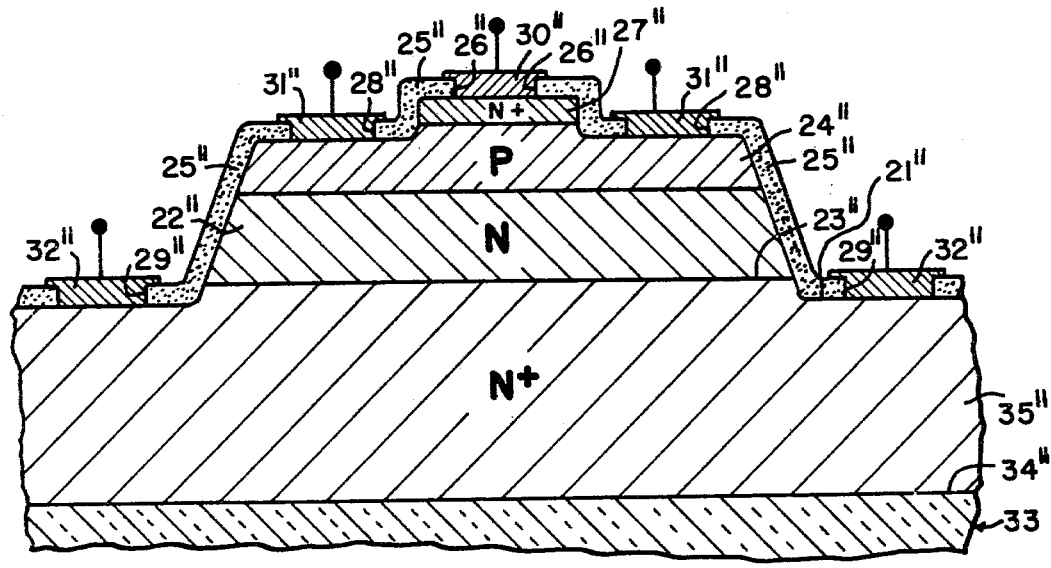
FIG. 12 is a cross-sectional view in elevation of a second alternative bipolar transistor of an integrated circuit made in accordance with the present invention.

Referring to FIG. 12, a series of NPN transistors in a thin-film integrated circuit similar to that shown in FIG. 11 is shown. The structure is identical except that the emitter 27" is epitaxially grown on silicon layer 24" instead of diffused into it. Preferably emitter 27" is grown by selective epitaxy through window 26" in oxide layer 25", see Rai-Choudhury and Schroder, J. Electrochem Soc.: Solid State Science, 118, 107 (1971). Alternatively, emitter 27" may be made by epitaxially growing a non-localized layer on layer 24" and subsequently selectively etching islands as shown before selectively etching layer 22" and 24".

Referring to FIGS. 13 and 14, the impurity concentration distribution and gain of the power transistor shown in FIG. 10 are shown. In FIG. 13, curves A, B and C show the impurity concentrations of the collector, base and emitter regions, respectively, of the transistor. In FIG. 14, curve A shows the common emitter current gain of the transistor as a function of collector current. It shows that the high lifetimes provided by the present invention impart high current gain to a large area transistor. From FIG. 14, the minority carrier lifetime of the epitaxially grown layer 24 is calculated to be approximately 100 microseconds.

It can thus be seen from FIGS. 11 through 14 that the present invention makes possible the use of bipolar transistors in applications where long minority carrier lifetime or the equivalent, diffusion length, is a parameter of utmost importance. It opens up the applications not only of bulk silicon transistors, but thin-film and particularly silicon-on-sapphire transistors.

Referring to FIG. 15, a complementary MOS transistor circuit suitable for a computer memory circuit is shown in a thin-film integrated circuit. Sapphire substrate 40 is provided with major surface 41 in the (1̄102) crystallographic orientation. Silicon layer 42 is epitaxially grown preferably by pyrolysis of monosilane (SiH₄) in hydrogen carrier gas at about 1000° C. Layer 42 is epitaxially grown at about 2 to 3 microns per minute to a depth of about 3 microns.

Silicon layer 42 is then heavily doped with phosphorus by standard diffusion techniques. For convenience, layer 42 is preferably doped from a constant diffusion-source of phosphine gas in an open-tube system. The layer is preferably doped to a surface impurity concentration of between $1 \times 10^{20}$ and $1 \times 10^{21}$ per cm³.

Silicon layer 43 is then epitaxially grown and simultaneously lightly doped preferably by pyrolysis of monosilane in hydrogen gas as above described to form NN junction at 44 with layer 42. Layer 43 is doped N-type to an impurity concentration of about $5 \times 10^{14}$ per cm³ by continuous introduction preferably of arsine (AsH₃) into the epitaxy system from a constant source. Preferably, the epitaxy is at a high rate of, for example, 5 microns per minute to reduce autodoping of layer 43 from layer 42. Layer 43 is preferably grown to a depth of about 2 to 3 microns.

Thereafter, layer 43 is selectively masked and etched to remove portions of the layer and form pairs of islands 45 and 46, as shown in FIG. 15, for the MOS transistors. This is preferably performed by standard photolithographic techniques and a suitable etchant such as potassium hydroxide, which is crystallographically sensitive, is used.

Silicon dioxide layer 47 is then deposited over the exposed surfaces of layers 42 and 43 to a depth of about 2500 Ångstroms. This is preferably accomplished by vapor deposition at about 700° C. Oxide layer 46 is then removed from one of each pair of islands, e.g. island 45, making-up lightly doped silicon layer 43 to provide for selective diffusion. A suitable P-type impurity such as boron is then diffused into the exposed islands 45 by standard diffusion techniques. Preferably a constant diffusion-source of diborane is used. Layer 43 at islands 45 is compensated and lightly doped P-type to an impurity concentration of about $5 \times 10^{15}$ per cm³.

The exposed P-doped islands 45 in lightly doped layer 43 are then covered by extending oxide layer 46. Again this is preferably done by vapor deposition at about 700° C.

Windows 48 and 49 are then opened in the oxide layer 47 at N-doped island 46 and heavily P-doped source, and drain regions 50 and 51 are diffused into the N-doped island 46. This is preferably accomplished by standard photolithographic and diffusion techniques as above described. Preferably a constant diffusion-source of diborane is used in an open-tube system. Preferably the impurity concentration is about $5 \times 10^{17}$ per cm³ to insure diffusion through to heavily N-doped layer 42 and to provide isolation of N-channel region 52. The impurity concentration should be maintained as low as possible within limits of transistor operation to provide as good an isolating PN junction with heavily N-doped layer 42 as possible and to insure that source and drain regions 50 and 51 do not penetrate heavily doped layer 42 significantly.

Windows 48 and 49 are then closed by extension of oxide layer 47 as above described.

Windows 53 and 54 are then opened in the P-doped islands 45 and heavily N-doped source and drain regions 55 and 56 are diffused into the P-doped islands 45 preferably to a concentration of about $1 \times 10^{19}$ per cm³. This is again accomplished by standard photolithographic and diffusion techniques. Preferably a constant diffusion-source of phosphine is used in an open-tube technique. Care must, however, be taken to insure that the source and drain regions 55 and 56 do not penetrate layer 43 and short circuit the device. Good isolation of the P-channel region 57 is provided by reason of the previous indiscriminate diffusion of P-type impurity into island 45.

Windows 48 and 49 are reopened, and window 58 opened to expose portions of heavily doped layer 42. This is again done by standard photolithographic and etching techniques. Preferably wells 59 and 60 are also formed in oxide layer 47 by stopping the etching during the formation of the windows, removing another portion of the photomask and continuing the etching process.

Metal contacts 61, 62, 63, 64, 65 and 66 are simultaneously formed to make ohmic contacts with layer 42 and source and drain regions 50, 51, 55 and 56, and MOS contacts with channel regions 52 and 57. This is accomplished by vaporizing aluminum or some other suitable metal over the structure to close windows 48, 49, 53, 54 and 58 and wells 59 and 60 and form a continuous metal layer over oxide layer 47. A "negative" mask with a standard photolithographic technique and an appropriate etchant such as 10% sodium hydroxide solution are then used to remove the metal layer from everywhere but in and adjacent to the closed windows and wells. The metal in the windows is then alloyed with the silicon by heating the structure to make low resistance ohmic contacts. Note that the well 59 and 60 control the location and spacing of the MOS contacts from the channel regions.

The thin-film silicon-on-sapphire device thus formed is a complementary MOS transistor circuit appropriate for operation in the enhancement mode. Contact 61 provides a reverse bias to the PN junctions with layer 42 to isolate the transistor. Contact 62 is common to the source regions 50 and 55 of the complementary transistor so that the circuit can operate in a "flip-flop" mode. The circuit can thus be used in the memory circuit of a computer.

Referring to FIG. 16, a similar complementary MOS transistor circuit is shown. The difference is that the P+N−P+ transistor is replaced with a P+P−P+ transistor appropriate for operation in the deep-depletion enhancement mode. This is accomplished by doping lightly doped silicon layer 43' with a P-type impurity such as boron instead of phosphorus during its epitaxial growth to form a PN junction at 44' instead of an NN junction. Preferably the impurity concentration junction is maintained at about $1 \times 10^{13}$ per cm$^3$ to provide the high resistivity in the channel region appropriate for operation in the deep-depletion enhancement mode.

This device has the advantage of eliminating a number of the steps necessary in the making of the complementary MOS transistor circuit above described in connection with FIG. 15. Further, it provides for better isolation of the circuit since no isolation PN junctions are required between the heavily doped source and drain region and the heavily doped layer 42'.

The present invention is thus utilized in making complementary MOS transistor by silicon-on-sapphire which have much lower leakage current and in turn much lower power dissipation. Thus, computers with larger memory units can be made utilizing CMOS transistor circuits.

Referring to FIG. 17, an image sensing target for a high resolution television camera tube is made utilizing the present invention. Sapphire substrate 70 is provided with a major surface 71 in the (1102) crystallographic orientation. Silicon layer 72 is then epitaxially grown on surface 71 preferably by pyrolysis of monosilane in hydrogen carrier gas as before described. The epitaxy is continued until layer 72 is of a depth of about 1 micron.

Layer 72 is then heavily N-doped with phosphorus by a standard diffusion system. Preferably a constant diffusion source of phosphine in an open-tube system is used. The impurity concentration of layer 72 is thus between $1 \times 10^{20}$ and $1 \times 10^{21}$ per cm$^3$.

Silicon layer 73 is then epitaxially grown on layer 72 to a depth of about 5 to 10 micron to form NN junction 74 with layer 72. Preferably, the epitaxy is again performed by pyrolysis of monosilane as above described. Simultaneously, layer 73 is lightly doped to about $5 \times 10^{14}$ per cm$^3$ by inputting arsine (AsH$_3$) or phosphine (PH$_3$) gas to the epitaxy system.

Silicon dioxide layer 75 is then formed over silicon layer 73 to a depth of about 0.5 microns. Preferably this is done by vapor deposition at about 700° C.

Thereafter, micro-windows 76 are opened in the oxide layer 75. The windows are typically spaced on 12.5 to 20 micron centers in a checkerboard array with a window diameter of 6 to 10 microns. As many as 700,000 windows can thus be formed in a $1.2 \times 1.2$ cm$^2$ piece. Preferably windows are formed by use of the electron image projection system, see U.S. applications Ser. Nos. 753,373, 869,229, 40,626 and 78,365, filed Aug. 19, 1968, Oct. 24, 1969, May 26, 1970 and Oct. 6, 1970, respectively, and assigned to the same assignee as the present invention.

P-type impurity regions 77 are then formed in N-doped layer 73 by diffusion through windows 76 in oxide layer 75. This is preferably performed using standard open-tube diffusion techniques with a constant diffusion-source of diborane gas. Regions 77 are preferably diffused to a depth of about 1 micron. Tiny diodes are thereby formed in silicon layer 73.

In operation, the diodes are made to face a scanning electron beam 78 as shown in FIG. 17. And the heavily doped layer 72 is maintained at a positive potential relative to the cathode 79 by power source 80 to charge the surface down to equilibrium potential, reverse biasing the diodes. Light or radiation 81 of interest is incident from the substrate side causing charge storage in the diodes in the pattern and to the degree of the intensity of the light. The scanning electron beam 78 converts the pattern of stored charge of the diodes to electrical input from the television camera tubes.

The sensitivity of the image sensing target depends only on the ability of a minority carrier hole, created by electron-hole generation by incident radiation within the field free heavily doped layer 72, to diffuse to the space charge region of the diode before recombination. Once the minority carrier hole reaches the space charge region, it is swept across into the P-doped region and is stored as a positive charge. The probability of this occurrence is called the "collection efficiency". The hole collection efficiency is thus seen to be directly dependent on minority carrier lifetime which must be in the microsecond range.

The present invention thus provides an image sensing target of high resolution that is made by silicon-on-sapphire technology. This makes a much more durable image sensing target than previously av..ilable. Previously such targets were made from self-supporting wafer of single crystal N-type silicon by etching the internal portion typically to a thickness of about 10 to 15 microns, see Gordon, Trans. of the Met. Soc. of AIME, 245, 517, 522-23 (1969). Such devices were difficult to make, having a low quantum yield, and were sensitive to shock and vibration during use. The present invention eliminates such difficulties and provides a simply made target which is shock and vibration resistant.

While the present preferred embodiments of the invention and methods of performing them have been specifically described, it is distinctly understood that the invention may be otherwise variously embodied and used.

What is claimed is:

1. A silicon-on-sapphire semiconductor having a region with a relatively long minority carrier lifetime comprised of:
   (a) a sapphire substrate with a major surface;
   (b) a heavily doped epitaxial silicon layer with a surface impurity concentration greater than about $1 \times 10^{19}$ per $cm^3$ of phosphorus impurity over the major surface of the sapphire substrate; and
   (c) a relatively lightly doped epitaxial silicon layer with an impurity concentration less than about $1 \times 10^{17}$ per $cm^3$ adjoining the heavily doped epitaxial silicon layer, said lightly doped epitaxial silicon layer having a relatively long minority carrier lifetime of greater than 50 nanoseconds.

2. A silicon-on-sapphire semiconductor device having a region with a relatively long minority carrier lifetime comprised of:
   (a) a sapphire substrate with a major surface;
   (b) a heavily doped epitaxial silicon layer with a surface impurity concentration greater than about $1 \times 10^{20}$ per $cm^3$ of phosphorus impurity over the major surface of the sapphire substrate; and
   (c) a relatively lightly doped epitaxial silicon layer with an impurity concentration less than about $1 \times 10^{17}$ per $cm^3$ adjoining the heavily doped epitaxial silicon layer, said lightly doped epitaxial silicon layer having a relatively long minority carrier lifetime of greater than 50 nanoseconds.

3. A silicon-on-sapphire semiconductor device having a region with a relatively long minority carrier lifetime comprised of:
   (a) a sapphire substrate with a major surface;
   (b) a heavily doped epitaxial silicon layer with a surface impurity concentration greater than about $1 \times 10^{19}$ per $cm^3$ of boron impurity over the major surface of the sapphire substrate; and
   (c) a relatively lightly doped epitaxial silicon layer with an impurity concentration less than about $1 \times 10^{17}$ per $cm^3$ adjoining the heavily doped epitaxial silicon layer, said lightly doped epitaxial silicon layer having a relatively long minority carrier lifetime of greater than 50 nanoseconds.

* * * * *